United States Patent [19]
Michael

[11] Patent Number: 5,563,102
[45] Date of Patent: Oct. 8, 1996

[54] METHOD OF SEALING INTEGRATED CIRCUITS

[75] Inventor: Keith W. Michael, Midland, Mich.

[73] Assignee: Dow Corning Corporation, Midland, Mich.

[21] Appl. No.: 465,286

[22] Filed: Jun. 5, 1995

Related U.S. Application Data

[62] Division of Ser. No. 23,450, Feb. 26, 1993.

[51] Int. Cl.$^6$ ..................................................... H01L 21/60
[52] U.S. Cl. ........................... 437/209; 437/183; 437/189; 437/192; 437/203
[58] Field of Search ..................................... 437/209, 183, 437/189, 190, 192, 203

[56] References Cited

U.S. PATENT DOCUMENTS

| | | | |
|---|---|---|---|
| 4,087,314 | 5/1978 | George et al. | 437/183 |
| 4,427,715 | 1/1984 | Harris | 437/183 |
| 4,749,631 | 6/1988 | Haluska et al. | |
| 4,756,977 | 7/1988 | Haluska et al. | |
| 4,855,257 | 8/1989 | Kouda | 437/183 |
| 5,136,364 | 8/1992 | Byrne | |
| 5,270,253 | 12/1993 | Arai et al. | 437/190 |

Primary Examiner—Kevin M. Picardat
Attorney, Agent, or Firm—Roger E. Gobrogge

[57] ABSTRACT

This invention relates to integrated circuits which are protected from the environment. Such circuits are sealed by applying a diffusion barrier metal layer to the bond pads and two passivation layers to the remainder of the circuit.

10 Claims, 1 Drawing Sheet

METHOD OF SEALING INTEGRATED CIRCUITS

This is a divisional of copending application(s) Ser. No. 08/023,450 filed on Feb. 26, 1993 pending.

BACKGROUND

The present invention relates to integrated circuits which are protected from the environment. These circuits are inexpensive to fabricate and have improved performance and reliability.

Modern electronic circuits must be able to withstand a wide variety of environmental conditions such as moisture, ions, heat and abrasion. A significant amount of work has been reported directed toward various protective measures to minimize the exposure of such circuits to the above conditions and thereby increase their reliability and life.

Many prior art processes for protecting electronic circuits have involved sealing or encapsulating the circuits after they have been interconnected. For example, it is known in the art to use materials such as silicones, polyimides, epoxies, other organics, plastics, and the like to encapsulate such interconnected circuits. The above materials, however, are of only limited value since most are permeable to environmental moisture and ions.

Similarly, interconnected circuits have also been sealed within ceramic packages. This process has proven to be relatively effective in increasing device reliability and is currently used in select applications. The added size, weight and cost involved in this method, however, inhibits widespread application in the electronic industry.

The use of lightweight ceramic protective coatings on electronic devices has also been suggested. For instance, Haluska et al. in U.S. Pat. Nos. 4,756,977 and 4,749,631 describe the use of ceramic silica coatings derived from hydrogen silsesquioxane and silicate esters, respectively, as well as additional ceramic layers as hermetic barriers. The present inventor has discovered that when such coatings are applied specifically to integrated circuits at the wafer stage and even though the bond pads are subsequently opened by removing a portion of the coating, the resultant circuits remain sealed and exhibit increased reliability and life.

Sealing circuits at the wafer stage is also known in the art. For example, it is known in the art to coat fabricated integrated circuits with ceramic materials such as silica and/or silicon nitride by CVD techniques. These coatings are then etched back at the bond pads for the application of leads. The wafers coated in this manner, however, have inadequate reliability and life.

Similarly, Byrne in U.S. Pat. No. 5,136,364 teaches a method for sealing integrated circuits at the wafer stage. The process described therein comprises applying a first passivation coating which overlaps the edges of an aluminum bonding pad on an integrated circuit, applying a sequence of conductive layers comprising a barrier metal layer and a noble metal layer which overlay the aluminum bond pad and which has edges which overlap the first passivation layer, and then applying a second passivation layer which overlaps the edges of the sequence of conductive layers. This process, however, is complex and involves many deposition/etch steps.

The present inventor has now developed a simple process for the protection of integrated circuits which involves sealing the bond pads of integrated circuits with diffusion barrier layers and sealing the remainder of the device with passivation layers.

SUMMARY OF THE INVENTION

The present invention relates to sealed integrated circuits. These circuits comprise a circuit subassembly having bond pads. A primary passivation layer covers the surface of this subassembly and openings are provided therein to expose at least a portion of the top surface of these bond pads. A diffusion barrier metal layer covers at least a portion of the top surfaces of the bond pads. A secondary passivation covers at least the primary passivation and the edges of the diffusion barrier metal layer.

DETAILED DESCRIPTION OF THE INVENTION

The present invention is based on the discovery that integrated circuits can be sealed by the application of diffusion barrier metal layers over the bond pads and ceramic layers over the remainder of the circuits. The diffusion barrier metal layers are corrosion resistant and inhibit contact of degradative materials with the bond pads. Similarly, the passivation layers inhibit degration of the remainder of the circuit by limiting contact with such degradative materials. The resultant sealed circuits can then be easily interconnected by bonding (eg., TAB, flip-chip, wire bonding, etc. with gold, copper, solder, etc.) to the diffusion barrier metal layer. These circuits are much simpler and cheaper to make than prior art circuits since they don't require sealed noble metal layers. In addition, since this process can be performed at the wafer stage, production can be simplified and, thus, costs reduced.

Figure 1:
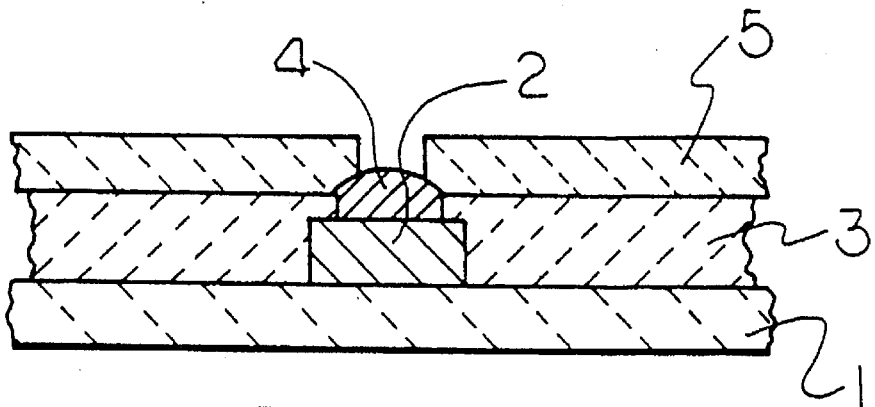
FIG. 1 is a cross-section of a semiconductor device having the primary passivation, diffusion barrier metal, and secondary passivation of the present invention.

The integrated circuit subassemblies used in the process of this invention are not critical and nearly any which are known in the art and/or produced commercially are useful herein. The processes used to produce such circuits are also known and not critical to the invention. Exemplary of such circuits are those comprising a semiconductor substrate (eg., silicon, gallium arsenide, etc.) having an epitaxial layer grown thereon. This epitaxial layer is appropriately doped to form the PN-junction regions which constitute the active regions of the device. These active regions are diodes and transistors which form the integrated circuit when appropriately interconnected by a properly patterned metallic layer. This metallic interconnect layer terminates at the bond pads on the exterior surface of the circuit subassembly. FIG. 1 depicts a cross-section of such a semiconductor substrate wherein (1) is the semiconductor substrate and (2) is the bond pad.

In the process of the present invention, the above integrated circuit subassemblies are sealed by (1) applying a primary passivation layer over the surface of this subassembly; (2) applying a diffusion barrier metal layer over at least a portion of the top surfaces of the bond pads; and (3) applying a secondary passivation over at least the primary passivation and the edges of the diffusion barrier metal layer. This is shown in FIG. 1 wherein (3) is primary passivation, (4) is the diffusion barrier metal and (5) is the secondary passivation.

The method for applying the primary passivation is not critical and nearly any approach can be used. Generally, however, the top surface of the subassembly, including the bond pads, is covered with the primary passivation and then the passivation covering the bond pads is etched. One example of a method for depositing the primary passivation involves applying a silicon-containing ceramic material by a process comprising coating the circuit with a composition comprising a preceramic silicon-containing material followed by converting the preceramic silicon-containing material to a ceramic. Typically, the preceramic silicon-containing material is converted to a ceramic by heating it to a sufficient temperature. This approach is particularly advantageous in that the resultant coating is planar.

As used in the present invention, the term "preceramic silicon-containing material" describes material which can be rendered sufficiently flowable to impregnate and coat the surface of a circuit and which can be subsequently converted to a solid layer exhibiting properties generally recognized by those skilled in the art as characteristic of a ceramic. These materials include, for example, precursors to silicon oxides, silicon nitride, silicon oxynitride, silicon oxycarbide, silicon carbonitride, silicon oxycarbonitride, silicon carbide and the like.

The preferred preceramic silicon-containing materials to be used in the process of this invention are precursors to silicon oxides, especially silica. The silica precursors which may be used in the invention include, but are not limited to, hydrogen silsesquioxane resin (H-resin), hydrolyzed or partially hydrolyzed $R_nSi(OR)_{4-n}$, or combinations of the above, in which each R is independently an aliphatic, alicyclic or aromatic substituent of 1–20 carbon atoms, preferably 1–4, such as an alkyl (eg. methyl, ethyl, propyl), alkenyl (eg. vinyl or allyl), alkynyl (eg. ethynyl), cyclopentyl, cyclohexyl, phenyl etc., and n is 0–3, preferably 0 or 1.

H-resin is used in this invention to describe a variety of hydridosilane resins having units of the structure $HSi(OH)_x(OR)_yO_{z/2}$ in which each R is independently an organic group which, when bonded to silicon through the oxygen atom, forms a hydrolyzable substituent, x=0–2, y=0–2, z=1–3, and x+y+z=3. These resins may be either fully condensed (x=0, y=0 and z=3) or they may be only partially hydrolyzed (y does not equal 0 over all the units of the polymer) and/or partially condensed (x does not equal 0 over all the units of the polymer). Although not represented by this structure, various units of these resins may have either zero or more than one Si—H bond due to various factors involved in their formation and handling. Exemplary of substantially condensed H-resins (less than about 300 ppm silanol) are those formed by the process of Frye et al. in U.S. Pat. No. 3,615,272 which is incorporated herein by reference. This polymeric material has units of the formula $(HSiO_{3/2})_n$ in which n is generally 8–1000. The preferred resin has a number average molecular weight of from about 800–2900 and a weight average molecular weight of between about 8000–28,000 (obtained by GPC analysis using polydimethylsiloxane as a calibration standard). When heated sufficiently, this material yields a ceramic coating essentially free of SiH bonds.

Exemplary H-resin which may not be fully condensed include those of Bank et al. in U.S. Pat. No. 5,010,159, or those of Weiss et al. in U.S. Pat. No. 4,999,397, both of which are incorporated herein by reference. Exemplary H-resin which is not fully hydrolyzed or condensed is that formed by a process which comprises hydrolyzing a hydrocarbonoxy hydridosilane with water in an acidified oxygen-containing polar organic solvent.

A platinum, rhodium or copper catalyst may be admixed with the hydrogen silsesquioxane to increase the rate and extent of its conversion to silica. Any platinum, rhodium or copper compound or complex that can be solubilized in this solution will be operable. For instance, an organoplatinum composition such as platinum acetylacetonate or rhodium catalyst $RhCl_3[S(CH_2CH_2CH_2CH_3)_2]_3$, obtained from Dow Corning Corporation, Midland, Mich. are all within the scope of this invention. The above catalysts are generally added to the solution in an amount of between about 5 and 500 ppm platinum or rhodium based on the weight of resin.

The second type of silica precursor material useful herein includes hydrolyzed or partially hydrolyzed compounds of the formula $R_nSi(OR)_{4-n}$ in which R and n are as defined above. Some of these materials are commercially available, for example, under the tradename ACCUGLASS. Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si—O—Si resins. Compounds in which x=2 or 3 are generally not used alone as volatile cyclic structures are generated during pyrolysis, but small amounts of said compounds may be cohydrolyzed with other silanes to prepare useful preceramic materials.

In addition to the above $SiO_2$ precursors, other ceramic oxide precursors may also be advantageously used herein either solely or in combination with the above $SiO_2$ precursors. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or an amino groups. Specific compounds, therefore, include zirconium tetracetylacetonate, titanium dibutoxy diacetylacetonate, aluminum triacetylacetonate, tetraisobutyl titanium and $Ti(N(CH_3)_2)_4$.

When $SiO_2$ is to be combined with one of the above ceramic oxide precursors, generally it is used in an amount such that the final ceramic contains 70 to 99.9 percent by weight $SiO_2$.

Examples of other silicon-containing preceramic materials include silicon carbonitride precursors such as hydridopolysilazane (HPZ) resin and methylpolydisilylazane (MPDZ) resin. Processes for the production of these materials are described in U.S. Pat. Nos. 4,540,803 and 4,340,619, respectively, both of which are incorporated herein by reference. Examples of silicon carbide precursors include polycarbosilanes and examples of silicon nitride precursors include polysilazanes. Oxygen can be incorporated into the ceramics resulting from the above precursors or the precursors can be converted to silica by pyrolyzing them in an oxygencontaining environment.

The above silicon-containing preceramic material is then used to coat the integrated circuit. The material can be used in any practical form but it is preferred to use a liquid comprising the preceramic material in a suitable solvent. If this solution approach is used, the preceramic liquid is generally formed by simply dissolving or suspending the preceramic material in a solvent or mixture of solvents. Various facilitating measures such as stirring and/or heat may be used to assist in the dissolution/dispersion. The solvents which may be used in this method include, for example, alcohols such as ethyl or isopropyl, aromatic hydrocarbons such as benzene or toluene, alkanes such as n-heptane or dodecane, ketones, cyclic dimethylpolysiloxanes, esters or glycol ethers, in an amount sufficient to dissolve or disperse the above materials to low solids. For instance, enough of the above solvent can be included to form a 0.1–85 weight percent solution.

The circuit is then coated with this liquid by means such as spin, spray, dip or flow coating and the solvent is allowed to evaporate. Any suitable means of evaporation such as simple air drying by exposure to an ambient environment or the application of a vacuum may be used.

Although the above described methods primarily focus on using a solution approach, one skilled in the art would recognize that other equivalent means (eg., melt impregnation) would also function herein and are contemplated to be within the scope of this invention.

The preceramic material is then typically converted to the silicon-containing ceramic by heating it to a sufficient temperature. Generally, the temperature is in the range of about 50 to about 1000° C. depending on the pyrolysis atmosphere and the preceramic compound. Preferred temperatures are in the range of about 50° to about 600° C. and more preferably 50°–400° C. Heating is generally conducted for a time sufficient to ceramify, generally up to about 6 hours, with less than about 2 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$, etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

Additional examples of methods for the application of the primary passivation include physical vapor deposition (PVD) or chemical vapor deposition (CVD) of coatings such as silicon oxygen containing coatings, silicon containing coatings, silicon carbon containing coatings, silicon nitrogen containing coatings, silicon oxygen nitrogen coatings, silicon nitrogen carbon containing coatings, silicon oxygen carbon containing coatings, silicon oxygen carbon nitrogen containing coatings and/or diamond like carbon coatings.

The materials and methods for the formation of these ceramic coatings are not critical to the invention and many are known in the art. Examples of applicable methods include a variety of chemical vapor deposition techniques such as conventional CVD, photochemical vapor deposition, plasma enhanced chemical vapor deposition (PECVD), electron cyclotron resonance (ECR), jet vapor deposition, etc. and a variety of physical vapor deposition techniques such as sputtering, electron beam evaporation, etc. These processes involve either the addition of energy (in the form of heat, plasma, etc.) to a vaporized species to cause the desired reaction or the focusing of energy on a solid sample of the material to cause its deposition.

In conventional chemical vapor deposition, the coating is deposited by passing a stream of the desired precursor gases over a heated substrate. When the precursor gases contact the hot surface, they react and deposit the coating. Substrate temperatures in the range of about 100–1000° C. are sufficient to form these coatings in several minutes to several hours, depending on the precursors and the thickness of the coating desired. If desired, reactive metals can be used in such a process to facilitate deposition.

In PECVD, the desired precursor gases are reacted by passing them through a plasma field. The reactive species thereby formed are then focused at the substrate and readily adhere. Generally, the advantage of this process over CVD is that lower substrate temperature can be used. For instance, substrate temperatures of about 20° up to about 600° C. are functional.

The plasma used in such processes can comprise energy derived from a variety of sources such as electric discharges, electromagnetic fields in the radio-frequency or microwave range, lasers or particle beams. Generally preferred in most plasma deposition processes is the use of radio frequency (10 kHz–$10^2$ MHz) or microwave (0.1–10 GHz) energy at moderate power densities (0.1–5 watts/cm$^2$). The specific frequency, power and pressure, however, are generally tailored to the precursor gases and the equipment used.

Examples of suitable processes for the deposition of the silicon containing coating described above include (a) the chemical vapor deposition of a silane, halosilane, halodisilane, halopolysilane or mixtures thereof, (b) the plasma enhanced chemical vapor deposition of a silane, halosilane, halodisilane, halopolysilane or mixtures thereof, or (c) the metal assisted chemical vapor deposition of a silane, halosilane, halodisilane, halopolysilane or mixtures thereof.

Examples of suitable processes for the deposition of the silicon carbon containing coating described above include (1) the chemical vapor deposition of a silane, alkylsilane, halosilane, halodisilane, halopolysilane or mixtures thereof optionally in the presence of an alkane of one to six carbon atoms or an alkylsilane, (2) the plasma enhanced chemical vapor deposition of a silane, alkylsilane, halosilane, halodisilane, halopolysilane or mixtures thereof optionally in the presence of an alkane of one to six carbon atoms or an alkylsilane or (3) the plasma enhanced chemical vapor deposition of a silacyclobutane or disilacyclobutane as further described in U.S. Pat. No. 5,011,706, which is incorporated herein in its entirety.

Examples of suitable processes for the deposition of the silicon oxygen carbon containing coating described above include (1) the chemical vapor deposition of a silane, alkylsilane, halosilane, halodisilane, halopolysilane or mixtures thereof optionally in the presence of an alkane of one to six carbon atoms or an alkylsilane and further in the presence of an oxidizing gas such as air, oxygen, ozone, nitrous oxide and the like, (2) the plasma enhanced chemical vapor deposition of a silane, alkylsilane, halosilane, halodisilane, halopolysilane or mixtures thereof optionally in the presence of an alkane of one to six carbon atoms or an alkylsilane and further in the presence of an oxidizing gas such as air, oxygen, ozone, nitrous oxide and the like or (3) the plasma enhanced chemical vapor deposition of a silacyclobutane or disilacyclobutane as further described in U.S. Pat. No. 5,011,706, which is incorporated herein in its entirety, in the presence of an oxidizing gas such as air, oxygen, ozone, nitrous oxide and the like.

Examples of suitable processes for the deposition of the silicon nitrogen containing coating described above include (A) the chemical vapor deposition of a silane, halosilane, halodisilane, halopolysilane or mixtures thereof in the presence of ammonia, (B) the plasma enhanced chemical vapor deposition of a silane, halosilane, halodisilane, halopolysilane, or mixtures thereof in the presence of ammonia, (C) the plasma enhanced chemical vapor deposition of a $SiH_4$—$N_2$ mixture such as that described by Ionic Systems or that of Katoh et al. in the Japanese Journal of Applied Physics, vol. 22, #5, pp1321–1323, or (D) reactive sputtering such as that described in Semiconductor International, p 34, August 1987.

Examples of suitable processes for the deposition of the silicon oxygen nitrogen containing coating described above include (A) the chemical vapor deposition of a silane, halosilane, halodisilane, halopolysilane or mixtures thereof in the presence of ammonia and an oxidizing gas such as air, oxygen, ozone, nitrous oxide and the like, (B) the plasma enhanced chemical vapor deposition of a silane, halosilane, halodisilane, halopolysilane, or mixtures thereof in the presence of ammonia and an oxidizing gas such as air, oxygen, ozone, nitrous oxide and the like, (C) the plasma enhanced chemical vapor deposition of a $SiH_4$—$N_2$ mixture such as that described by Ienic Systems or that of Katoh et al. in the Japanese Journal of Applied Physics, vol. 22, #5, pp1321–1323 in the presence of an oxidizing gas such as air, oxygen, ozone, nitrous oxide and the like, or (D) reactive sputtering such as that described in Semiconductor International, p 34, August 1987 in the presence of an oxidizing gas such as air, oxygen, ozone, nitrous oxide and the like.

Examples of suitable processes for the deposition of the silicon oxygen containing coating described above include (A) the chemical vapor deposition of a silane, halosilane, halodisilane, halopolysilane or mixtures thereof in the presence of an oxidizing gas such as air, oxygen, ozone, nitrous oxide and the like, (B) the plasma enhanced chemical vapor deposition of a silane, halosilane, halodisilane, halopolysilane, or mixtures thereof in the presence of an oxidizing gas such as air, oxygen, ozone, nitrous oxide and the like, (c) the chemical vapor deposition or plasma enhanced chemical vapor deposition of tetraethylorthosilicate, methyltrimethoxysilane, methylhydrogensiloxanes, dimethylsiloxanes and the like in the presence of an oxidizing gas such as air, oxygen, ozone, nitrous oxide and the like, or (d) the chemical vapor deposition or plasma enhanced chemical vapor deposition of hydrogen silsesquioxane resin in the presence of an oxidizing gas such as air, oxygen, ozone, nitrous oxide and the like as described in U.S. Pat. No. 5,165,955, which is incorporated herein by reference.

Examples of suitable processes for the deposition of the silicon carbon nitrogen containing coating described above include (i) the chemical vapor deposition of hexamethyldisilazane, (ii) the plasma enhanced chemical vapor deposition of hexamethyldisilazane, (iii) the chemical vapor deposition of silane, alkylsilane, halosilane, halodisilane, halopolysilane or mixture thereof optionally in the presence of an alkane of one to six carbon atoms or an alkylsilane and further in the presence of ammonia, or (iv) the plasma enhanced chemical vapor deposition of a silane, alkylsilane, halosilane, halodisilane, halopolysilane or mixture thereof optionally in the presence of an alkane of one to six carbon atoms or an alkylsilane and further in the presence of ammonia.

Examples of suitable processes for the deposition of the silicon oxygen carbon nitrogen containing coating described above include (i) the chemical vapor deposition of hexamethyldisilazane in the presence of an oxidizing gas such as air, oxygen, ozone, nitrous oxide and the like, (ii) the plasma enhanced chemical vapor deposition of hexamethyldisilazane in the presence of an oxidizing gas such as air, oxygen, ozone, nitrous oxide and the like, (iii) the chemical vapor deposition of silane, alkylsilane, halosilane, halodisilane, halopolysilane or mixture thereof optionally in the presence of an alkane of one to six carbon atoms or an alkylsilane and further in the presence of ammonia and an oxidizing gas such as air, oxygen, ozone, nitrous oxide and the like, or (iv) the plasma enhanced chemical vapor deposition of a silane, alkylsilane, halosilane, halodisilane, halopolysilane or mixture thereof optionally in the presence of an alkane of one to six carbon atoms or an alkylsilane and further in the presence of ammonia and an oxidizing gas such as air, oxygen, ozone, nitrous oxide and the like.

Examples of suitable processes for the deposition of the diamond-like carbon coating described above include exposing the substrate to an argon beam containing a hydrocarbon in the manner described in NASA Tech Briefs, November 1989 or by one of the methods described by Spear in J. Am. Ceram. Soc., 72, 171–191 (1989).

It should be noted that the primary passivation may be doped with other agents, if desired. For instance, the coatings may be doped with boron, phosphorous, or carbon to modify its characteristics.

Figure 2:
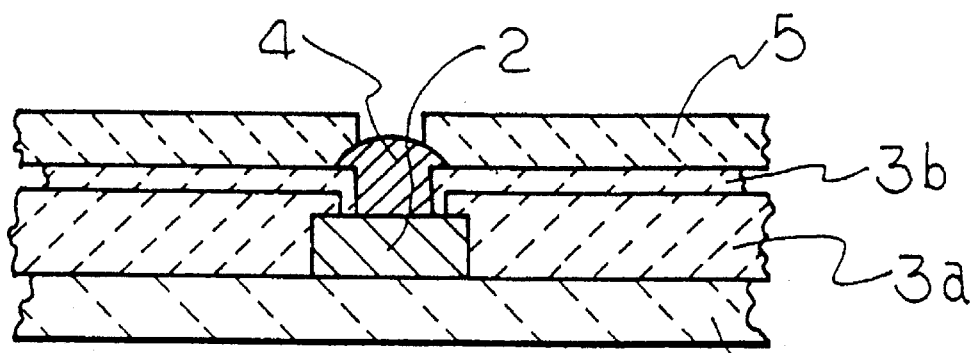
FIG. 2 is a cross-section of a semiconductor device having a 2 layer primary passivation, diffusion barrier metal and the secondary passivation of the present invention.

Either one or more of the above coatings may be used as the primary passivation. In a preferred embodiment of the invention, a silicon-containing ceramic layer derived from a preceramic silicon-containing material is used as a first planar layer and a second layer of a material such as silicon nitride or silicon carbide is applied on top of the first layer by CVD. FIG. 2 depicts a cross-section of such a semiconductor substrate (1) having a bond pad (2), a primary passivation comprising a silicon containing ceramic layer derived from a preceramic silicon containing material (3a) and layer applied by CVD (3b), a barrier metal (4) and the secondary passivation layer (5).

If the standard approach is utilized, the coating covering the bond pad is etched or partially etched to expose the top surface of the bond pad for deposition of the diffusion barrier metal layer. In one embodiment of the invention, the primary passivation on the entire top surface of the bond pad can be removed. In the preferred embodiment, however, only a portion of the primary passivation on the top surface of bond pad is removed such that the primary passivation overlaps the edges and the top surface of the bond pad. It should be noted, however, that other approaches which result in open bond pads may also be used (eg., depositing the coating only around the bond pads).

The method of etching is not critical and nearly any process known in the art will function herein. This includes, for example, dry etching (eg., with plasma), wet etching (eg., with aqueous hydrofluoric acid) and/or laser ablation.

It should be noted that circuits having a primary passivation and methods for their manufacture are known in the art. For instance, it is known to apply a primary passivation comprising one or more ceramic coatings of silica, silicon nitride or silicon oxynitride by a chemical vapor deposition technique employing precursors such as silane and oxygen, nitrous oxide, nitrogen, and ammonia. Similarly, it is known in the art to etch these coatings to expose the bond pads for interconnection. What has not been described in this prior art, however, is the deposition of a diffusion barrier metal layer and a secondary passivation on such circuits.

The diffusion barrier metal layer useful herein is not critical and is generally known in the art for use within integrated circuits for building the multiple layers of the circuit. Generally, such a layer comprises one or more coatings of metals and metal alloys such as tungsten, titanium-tungsten, titanium-nitride, nickel-vanadium, chromium, nickel-chromium, and the like.

The method for forming the diffusion barrier metal layer is also not critical and many techniques are known in the art. Examples of such processes include various physical vapor deposition (PVD) techniques such as sputtering and electron beam evaporation. A common approach involves sputtering the barrier metal layer on the surface of the circuit followed by etching to define the area of the barrier metal coverage.

Figure 3:
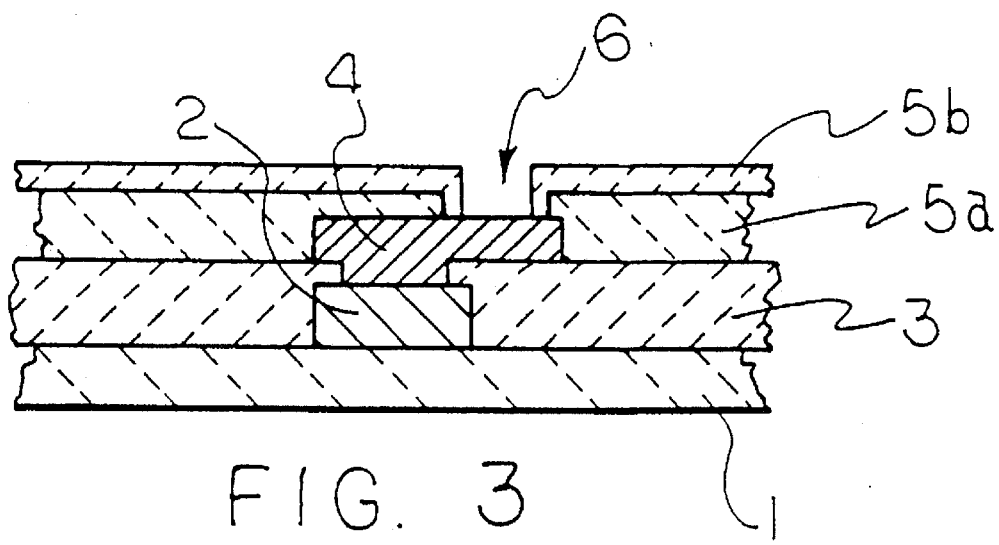
FIG. 3 is a cross-section of a semiconductor device having the primary passivation, diffusion barrier metal and 2 layer secondary passivation of the present invention. This Figure also shows a relocated bond pad.

The diffusion barrier metal layer may be applied in nearly any geometric configuration desired. In a preferred embodiment of the invention, the diffusion barrier metal layer overlaps the first passivation layer to provide additional protection. This is shown in FIGS. 1, 2, and 3 wherein the barrier metal (4) overlaps the primary passivation (3). In a second preferred embodiment, the diffusion barrier metal layer is used to relocate the bond pad to an area which is not vertically above the original bond pad. This is shown in FIG. 3 wherein opening (6) is etched in the secondary passivation at a location not directly above the original bond pad (2).

After the bond pads have been sealed with diffusion barrier metal layer, a secondary passivation comprising one or more additional ceramic layers is applied to the circuit. This secondary passivation is applied in a manner such that the primary passivation and the edges of the diffusion barrier metal layer are covered. In a preferred embodiment, the secondary passivation layer also overlaps the top surface or the diffusion barrier metal layer. FIG. 2 depicts a cross-section of such a semiconductor substrate (1) having a bond pad (2), a primary passivation (3), a barrier metal (4) and a secondary passivation layer which overlaps the top surface of the barrier metal comprising a silicon containing ceramic layer derived from a perceramic silicon containing material (5a) and layer applied by CVD (5b).

The secondary passivation and its method of application are essentially identical to those of the primary passivation described above. This layer seals any pores, pinholes and defects in the primary passivation and it seals the edges of the barrier diffusion metal layer to insure a complete seal.

Generally, the seconday passivation is applied to the entire top surface of the circuit including the primary passivation and the diffusion barrier metal layer. After application, the coating covering the diffusion barrier metal layer is etched or partially etched to allow for attachment of leads. The methods of etching are essentially as described above. It should again be noted that alternative means of applying the secondary passivation may be used.

After the secondary passivation covering the bond pads has been etched, the circuits are heremetically sealed such that they can be handled and/or transported without damage. In addition, either of the passivation layers may absorb UV or visible light to prevent damage and inhibit inspection. Moreover, circuits sealed in this manner are extremely flexible in methods for interconnection. For instance, bumps of gold, copper, solder or the like can be applied to the circuit for use in "flip-chip" or TAB interconnection. Alternatively, leads can be bonded to the diffusion barrier metal layer or silver filled epoxy interconnects can be formed. This flexible approach is much more desirable than alternative designs in which noble metals are required.

After interconnection, the device can also be packaged by conventional techniques known in the art. For instance, the device can be embedded within an organic encapsulant such as a polyimide, an epoxy or PARYLENE™, it can be embedded within a silicone encapsulant or it can be included in a plastic package for additional protection.

That which is claimed is:

1. A method for sealing an integrated circuit subassembly having bond pads consisting essentially of;

applying a primary passivation layer comprising at least one coating selected from the group consisting of silicon oxides, silicon nitride, silicon oxynitride, silicon oxycarbide, silicon carbonitride, silicon oxycarbonitride and silicon carbide over the surface of the subassembly and the bond pads;

etching the primary passivation to expose at least a portion of the top surface of the bond pads;

applying a diffusion barrier metal layer selected from the group consisting of titanium, titanium-tungsten, titanium-nitride, nickel-vanadium, chromium, and nickel-chromium over at least a portion of the top surfaces of the bond pads exposed through the primary passivation;

applying a secondary passivation comprising at least one coating selected from the group consisting of silicon oxides, silicon nitride, silicon oxynitride, silicon oxycarbide, silicon carbonitride, silicon oxycarbonitride and silicon carbide over the primary passivation and the diffusion barrier metal layer; and etching the secondary passivation to expose at least a portion of the top surfaces of the diffusion barrier metal layer.

2. The method of claim 1 wherein the primary passivation layer is doped with an agent selected from the group consisting of boron, phosphorus and carbon.

3. The method of claim 1 wherein the primary passivation layer is deposited by coating the circuit with a composition comprising a preceramic silicon-containing material followed by converting said material to a ceramic.

4. The method of claim 1 wherein the primary passivation is applied by a process selected from the group consisting of physical vapor deposition and chemical vapor deposition.

5. The method of claim 3 wherein the preceramic silicon-containing material is hydrogen silsesquioxane resin.

6. The method of claim 1 wherein the primary passivation layer comprises a silicon oxide coating covered by at least one coating selected from the group consisting of $SiO_2$ coatings, $SiO_2$/ceramic oxide coatings, silicon coatings, silicon carbon containing coatings, silicon nitrogen containing coatings, silicon oxygen nitrogen containing coatings, silicon carbon nitrogen containing coatings and diamond-like carbon coatings.

7. The method of claim 1 wherein the secondary passivation layer is deposited by coating the circuit with a composition comprising a preceramic silicon-containing material followed by converting said material to a ceramic.

8. The method of claim 1 wherein the secondary passivation is applied by a process selected from the group consisting of physical vapor deposition and chemical vapor deposition.

9. The method of claim 7 wherein the preceramic silicon-containing material is hydrogen silsesquioxane resin.

10. The method of claim 1 wherein the secondary passivation layer comprises a silicon oxide coating covered by at least one coating selected from the group consisting of $SiO_2$ coatings, $SiO_2$/ceramic oxide coatings, silicon coatings, silicon carbon containing coatings, silicon nitrogen containing coatings, silicon oxygen nitrogen containing coatings, silicon carbon nitrogen containing coatings and diamond-like carbon coatings.

* * * * *